(12) United States Patent
Sugimoto et al.

(10) Patent No.: US 10,943,981 B2
(45) Date of Patent: Mar. 9, 2021

(54) SEMICONDUCTOR DEVICE

(71) Applicant: FLOSFIA INC., Kyoto (JP)

(72) Inventors: Masahiro Sugimoto, Kyoto (JP); Isao Takahashi, Kyoto (JP); Takashi Shinohe, Kyoto (JP); Toshimi Hitora, Kyoto (JP)

(73) Assignee: FLOSFIA INC., Kyoto (JP)

( * ) Notice: Subject to any disclaimer, the term of this patent is extended or adjusted under 35 U.S.C. 154(b) by 158 days.

(21) Appl. No.: 16/110,123

(22) Filed: Aug. 23, 2018

(65) Prior Publication Data
US 2019/0067426 A1 Feb. 28, 2019

(30) Foreign Application Priority Data
Aug. 24, 2017 (JP) .............. JP2017-161677

(51) Int. Cl.
| | | |
|---|---|---|
| *H01L 29/24* | (2006.01) | |
| *H01L 29/868* | (2006.01) | |
| *H01L 29/06* | (2006.01) | |
| *H01L 29/04* | (2006.01) | |
| *H01L 21/02* | (2006.01) | |
| *H01L 29/66* | (2006.01) | |
| *H01L 29/872* | (2006.01) | |

(52) U.S. Cl.
CPC .......... *H01L 29/24* (2013.01); *H01L 21/0262* (2013.01); *H01L 21/02483* (2013.01); *H01L 21/02502* (2013.01); *H01L 21/02565* (2013.01); *H01L 21/02576* (2013.01); *H01L 21/02579* (2013.01); *H01L 21/02581* (2013.01); *H01L 21/02628* (2013.01); *H01L 29/04* (2013.01); *H01L 29/045* (2013.01); *H01L 29/063* (2013.01); *H01L 29/0619* (2013.01); *H01L 29/66969* (2013.01); *H01L 29/868* (2013.01); *H01L 29/872* (2013.01)

(58) Field of Classification Search
CPC ... H01L 29/04; H01L 29/045; H01L 29/0619; H01L 29/063; H01L 29/24; H01L 29/66969; H01L 29/868; H01L 29/872
USPC ...................................... 257/40–49
See application file for complete search history.

(56) References Cited

U.S. PATENT DOCUMENTS

2014/0217470 A1 8/2014 Sasaki et al.
2017/0200790 A1* 7/2017 Hitora ................. H01L 29/78

FOREIGN PATENT DOCUMENTS

| | | |
|---|---|---|
| JP | 08-102545 | 4/1996 |
| JP | 2011-222550 | 11/2011 |
| JP | 2016-025256 | 2/2016 |
| WO | WO2013/035843 | 3/2013 |
| WO | WO2015/040712 | 3/2015 |
| WO | 2016/013554 | 1/2016 |

* cited by examiner

*Primary Examiner* — Marvin Payen
(74) *Attorney, Agent, or Firm* — Wenderoth, Lind & Ponack, L.L.P.

(57) ABSTRACT

In a first aspect of a present inventive subject matter, a semiconductor device includes an n-type semiconductor layer, an i-type semiconductor layer and a p-type semiconductor layer. The i-type semiconductor layer includes an oxide semiconductor as a major component. The oxide semiconductor that is included as the major component of the i-type semiconductor layer includes at least one metal selected from among aluminum, indium, and gallium.

20 Claims, 9 Drawing Sheets (g)

US 10,943,981 B2

SEMICONDUCTOR DEVICE

CROSS-REFERENCE TO RELATED INVENTION

This application is a new U.S. patent application that claims priority benefit of Japanese patent application No. 2017-161677 filed on Aug. 24, 2017, the disclosures of which are incorporated herein by reference in its entirety.

BACKGROUND OF THE INVENTION

Field of the Invention

The present disclosure relates to a semiconductor device.

Description of the Related Art

A PiN diode including an n-type semiconductor layer, an i-type semiconductor and a p-type semiconductor layer is known. When turning on the PiN diode, holes are injected from the p-type semiconductor layer to the i-type semiconductor layer, electrons are injected from the n-type semiconductor layer to the i-type semiconductor layer, so that a conductivity modulation occurs in the i-type semiconductor layer. When turning off the PiN diode, a carriers (holes and electrons) existed in a high resistance area (i-type semiconductor layer) are discharged through the p-type semiconductor layer and the n-type semiconductor layer, and the PiN diode becomes electrically non-conductive.

It is open to public that an irradiation of a proton to an i-type semiconductor layer from both sides of an n-type semiconductor layer and a p-type layer can make a crystal defects in an interface of the n-type semiconductor layer and the i-type semiconductor layer and a crystal defects in an interface of the p-type semiconductor layer and the i-type semiconductor layer, so that a reverse recovery charge may be decreased. (For reference, see Japanese Unexamined Patent Application Publication No. H08-102545)

It is open to public that by in order to decrease a reverse recovery current and to increase the breakdown voltage, following measures are taken. 1. Make an i-type semiconductor layer to be 50 µm or more in thickness. 2. Include oxide in the whole are of an i-type semiconductor layer and form a complex defect in which atomic vacancies and oxygen are bonded.
(For reference, see Japanese Unexamined Patent Application Publication No. 2011-222550).

SUMMARY OF THE INVENTION

In a first aspect of a present inventive subject matter, a semiconductor device includes an n-type semiconductor layer, an i-type semiconductor layer and a p-type semiconductor layer. The i-type semiconductor layer includes an oxide semiconductor as a major component. The oxide semiconductor that is comprised as the major component of the i-type semiconductor layer includes at least one metal selected from among aluminum, indium, and gallium.

In the second aspect of a present inventive subject matter, a semiconductor device comprising an n-type semiconductor layer, an i-type semiconductor layer and a p-type semiconductor layer. The p-type semiconductor layer includes an oxide semiconductor as a major component. The oxide semiconductor that is comprised as the major component of the p-type semiconductor layer includes iridium or gallium.

In a third aspect of a present inventive subject matter, a semiconductor device includes an n-type semiconductor layer, an i-type semiconductor layer and a p-type semiconductor layer. The n-type semiconductor layer includes an oxide semiconductor as a major component, and the oxide semiconductor that is comprised as the major component of the n-type semiconductor layer includes at least one metal selected from among aluminum, indium, and gallium.

DETAILED DESCRIPTION OF EMBODIMENTS

Figure 1:
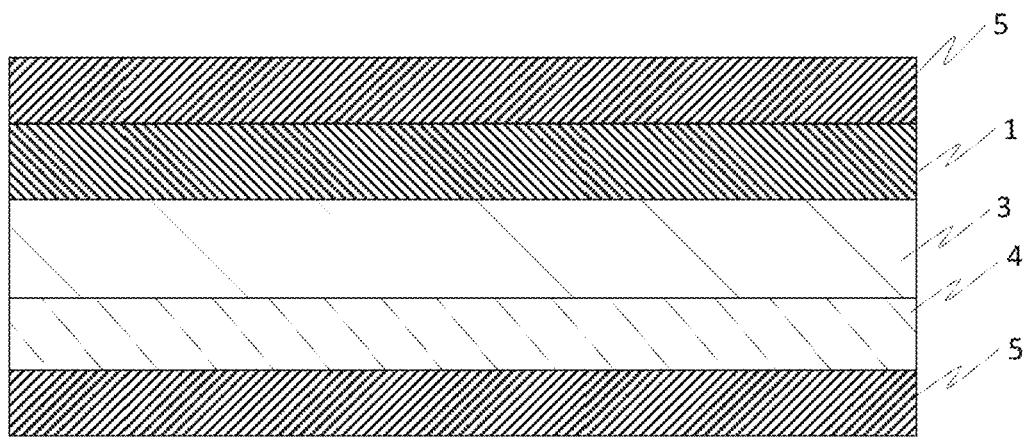
FIG. 1 shows an embodiment of a schematic perspective view of a PiN diode according to the present inventive subject matter.

As used herein, the term "and/or" includes any and all combinations of one or more of the associated listed items.

As illustrated in the figures submitted herewith, some size of structures or portions may be exaggerated relative to other structures or portions for illustrative purposes.

According to a first aspect of a present inventive subject matter, a semiconductor device includes an n-type semiconductor layer, an i-type semiconductor layer and a p-type semiconductor layer. The i-type semiconductor layer includes an oxide semiconductor as a major component. The oxide semiconductor that is comprised as the major component of the i-type semiconductor layer includes at least one metal selected from among aluminum, indium, and gallium.

The n-type semiconductor layer is not particularly limited, but for example, the n-type semiconductor layer contains an oxide semiconductor as a major component and the oxide semiconductor that is contained as the major component of the n-type semiconductor layer contains at least one metal selected from among aluminum, indium and gallium. According to an embodiment of the present inventive subject matter, the oxide semiconductor that is contained as the major component of the n-type semiconductor layer (hereinafter, also referred to as "the first semiconductor") may preferably contains at least gallium, so that the semiconductor device with an enhanced breakdown voltage, even when a material of the n-type semiconductor layer differs from a material of the i-type semiconductor layer or the p-type semiconductor layer. According to an embodiment of the present inventive subject matter, it is more preferable that the first semiconductor is $\alpha$-$Ga_2O_3$ or a mixed crystal of $\alpha$-$Ga_2O_3$. Also, according to an embodiment of the present inventive subject matter, the first semiconductor may be preferably a crystalline oxide semiconductor and may preferably has a corundum structure, $\beta$-gallia structure or an $\epsilon$-type structure, and more preferably has a corundum structure. Use of a corundum-structured oxide semiconductor containing at least gallium as the first semiconductor would improve a semiconductor characteristic of the semiconductor device without impairing a breakdown voltage. For example, even when a material having smaller bandgap than the first semiconductor as the third semiconductor, a depletion region would be extended to a side of the n-type semiconductor layer.

According to an embodiment of the present inventive subject matter, the n-type semiconductor layer preferably includes an n-type dopant. Examples of the n-type dopant may include tin, germanium, silicon, titanium, zirconium, vanadium, or niobium. A concentration of the n-type dopant in the n-type semiconductor layer is not particularly limited. According to an embodiment of the present inventive subject matter, the concentration of the n-type dopant in the n-type semiconductor layer preferably is $1\times10^{16}/cm^3$ to $1\times10^{22}/cm^3$, more preferably is $1\times10^{17}/cm^3$ to $1\times10^{22}/cm^3$, is most preferably $1\times10^{18}/cm^3$ to $1\times10^{22}/cm^3$. The term "major component" herein means, for example, in a case that the first semiconductor is $\alpha$-$Ga_2O_3$, an atomic ratio of gallium in a metal element in the n-type semiconductor layer may be 0.5 or more. According to an embodiment of the present inventive subject matter, the atomic ratio of gallium in a metal element in the n-type semiconductor layer may be preferably 0.7 or more. According to an embodiment of the present inventive subject matter, the atomic ratio of gallium in a metal element in the n-type semiconductor layer may be further preferably 0.8 or more.

The p-type semiconductor layer is not particularly limited, but for example, the p-type semiconductor layer contains a d-block metal in the periodic table or a p-block metal in the periodic table. According to an embodiment of the present inventive subject matter, the p-type semiconductor may preferably include an oxide semiconductor as a major component, and the oxide semiconductor that is included as the major component of the p-type semiconductor layer preferably includes a d-block metal in the periodic table. The term "periodic table" herein means periodic table defined by the International Union of Pure and Applied Chemistry (IUPAC). The term "d-block" herein means an element that has electrons that fill the 3$d$, 4$d$, 5$d$, and 6$d$ orbitals. Examples of a d-block metal in the periodic table may include at least one metal selected from among Scandium (Sc), titanium (Ti), vanadium (V), chromium (Cr), manganese (Mn), iron (Fe), cobalt (Co), Nickel (Ni), copper (Cu), zinc (Zn), yttrium (Y), zirconium (Zr), niobium (Nb), Molybdenum (Mo), technetium (Tc), ruthenium (Ru), rhodium (Rh), palladium (Pd), silver (Ag), Cadmium (Cd), lutetium (Lu), hafnium (Hf), tantalum (Ta), tungsten (W), Rhenium (Re), osmium (Os), iridium (Ir), platinum (Pt), gold (Au), mercury (Hg), Laurenzium (Lr), Rutherfordium (Rf), Dobnium (Db), Sea Bowium (Sg), Borium (Bh), Hassium (Hs), Mytnerium (Mt), Damstatium (Ds), Rentogenium (Rg) and Copernium (Cn). According to an embodiment of the present inventive subject matter, a d-block metal in the periodic table may be a transition metal, may be preferably a metal of Group 9 of the periodic table, may be further preferably at least one metal selected from among rhodium, iridium and cobalt, and may be most preferably iridium. According to an embodiment of the present inventive subject matter, the oxide semiconductor that is included as the major component of the p-type semiconductor layer (hereinafter, also referred to as "the third semiconductor") may be a crystalline oxide semiconductor. According to an embodiment of the present inventive subject matter, the third semiconductor may preferably contain a corundum structure, $\beta$-gallia structure or an $\epsilon$-type structure, more may preferably contain a corundum structure. The term "major component" herein means, for example, in a case that the third semiconductor is $\alpha$-$Ir_2O_3$, an atomic ratio of iridium in a metal element in the p-type semiconductor layer may be 0.5 or more. According to an embodiment of the present inventive subject matter, the atomic ratio of iridium in a metal element in the p-type semiconductor layer may be preferably 0.7 or more. For a present inventive subject matter, the atomic ratio of iridium in a metal element in the p-type semiconductor layer may be further preferably 0.8 or more. According to an embodiment of the present inventive subject matter, it is also preferable that the third semiconductor contains gallium, for a reason that it is possible to improve the breakdown voltage of the semiconductor device and if the third semiconductor contains gallium, the third semiconductor may be preferably $\alpha$-$Ga_2O_3$ or a mixed crystal of $\alpha$-$Ga_2O_3$.

According to an embodiment of the present inventive subject matter, the p-type semiconductor preferably contains a p-type dopant. Examples of the p-type dopant may include at least one metal selected from among Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N and P. According to an embodiment of the present inventive subject matter, the p-type dopant preferably includes a metal of Group 1 or 2 of the periodic table. Also, According to an embodiment of the present inventive subject matter, the p-type dopant may be preferably a metal of Group 12 of the periodic table. According to an embodiment of the present inventive subject matter, the p-type dopant may be preferably a metal selected from among Mg, Ca and Zn. A concentration of the p-type dopant is not particularly limited. The concentration of the p-type dopant may be preferably $1\times10^{16}/cm^3$ to $1\times10^{22}/cm^3$, may be further preferably $1\times10^{17}/cm^3$ to $1\times10^{22}/cm^3$, and may be most preferably $1\times10^{18}/cm^3$ to $1\times10^{22}/cm^3$. Also, according to an embodiment of the present inventive subject matter, the concentration of the p-type dopant may be preferably a high value such as $1\times10^{19}/cm^3$ or more, and may be further preferably $1\times10^{20}/cm^3$ or more. Such a high concentration of the p-type dopant would enable to maintain a high breakdown voltage of the semiconductor device even when using a material (iridium oxide, for example), as the third semiconductor, with lower band gap than the first semiconductor (gallium oxide, for example).

The i-type semiconductor is not particularly limited, but for example, the i-type semiconductor layer contains an oxide semiconductor that is the same as the oxide semiconductor contained as the major component of the n-type semiconductor or the p-type semiconductor. According to an embodiment of the present inventive subject matter, it is preferable that the oxide semiconductor that is contained as the major component of the i-type semiconductor layer (hereinafter, also referred to as "the second semiconductor") may be a crystalline oxide semiconductor. According to an embodiment of the present inventive subject matter, the second semiconductor may preferably contain a corundum structure, β-gallia structure or an ε-type structure, more may preferably contain a corundum structure. Also, according to an embodiment of the present inventive subject matter, the second semiconductor may preferably contain at least one metal selected from among aluminum, indium and gallium, may be more preferably $\alpha$-$Ga_2O_3$ or a mixed crystal of $\alpha$-$Ga_2O_3$. Use of such a preferable material as the second semiconductor would enable to improve a semiconductor characteristics without impairing a breakdown voltage of the semiconductor device, even when a material having smaller bandgap than the second semiconductor is used as the third semiconductor. The term "major component" herein means, for example, in a case that the first semiconductor is $\alpha$-$Ga_2O_3$, an atomic ratio of gallium in a metal element in the n-type semiconductor layer may be 0.5 or more. According to an embodiment of the present inventive subject matter, the atomic ratio of gallium in a metal element in the n-type semiconductor layer may be preferably 0.7 or more. According to an embodiment of the present inventive subject matter, the atomic ratio of gallium in a metal element in the n-type semiconductor layer may be further preferably 0.8 or more. The i-type semiconductor layer may contain a dopant. When the i-type semiconductor layer contains a dopant, example of the dopant that is contained in the i-type semiconductor layer may include an n-type dopant or a p-type dopant. According to an embodiment of the present inventive subject matter, the dopant that is contained in the i-type semiconductor layer may be preferably an n-type dopant such as tin, germanium, silicon, titanium, zirconium, vanadium, or niobium. A concentration of the dopant of the i-type semiconductor layer may be in general smaller than the concentration of the n-type dopant in the n-type semiconductor layer and the p-type dopant in the p-type semiconductor layer. According to an embodiment of the present inventive subject matter, the concentration of the dopant that is contained in the i-type semiconductor layer may be preferably $1\times10^{18}/cm^3$ or less, may be further preferably $1\times10^{17}/cm^3$ or less. Also, according to an embodiment of the present inventive subject matter, by using $\alpha$-$Ga_2O_3$ or a mixed crystal of $\alpha$-$Ga_2O_3$ as the first semiconductor, the semiconductor device with sufficient breakdown voltage may be obtained, even when the concentration of the dopant contained in the i-type semiconductor layer is relatively high ($1\times10^{17}/cm^3$, for example).

The thickness of the n-type semiconductor layer is not particularly limited and may be 1 μm or more. The thickness of the p-type semiconductor layer is not particularly limited and may be 1 μm or more. The thickness of the i-type semiconductor layer is not particularly limited and may be 1 μm or more. According to an embodiment of the present inventive subject matter, the thickness of the i-type semiconductor layer may be preferably 50 μm or less, may be further preferably 30 μm or less, and may be most preferably 10 μm or less. According to an embodiment of the present inventive subject matter, the semiconductor device with sufficient breakdown voltage may be obtained, even when the thickness of the i-type semiconductor layer is such a small value as described. Each of the first semiconductor, the second semiconductor and the third semiconductor may be a single crystal or polycrystalline.

The n-type semiconductor layer, the i-type semiconductor layer and the p-type semiconductor layer (hereinafter, also referred to as "the semiconductor layer") is preferably obtainable, by using an mist-CVD apparatus for example, by atomization and/or forming droplets of a raw material solution at the atomization and/or forming droplets process as mentioned below, carrying mist and/or droplets to be delivered to a base by carrier gas at the carrying mist and/or droplets process as mentioned below, and the semiconductor layer containing an oxide semiconductor is formed on the base that is positioned in a film forming chamber by thermal reaction of the mist and/or droplets of the raw material solution at the film-formation process as mentioned below.

(A Base)

A base is not particularly limited if it is capable of supporting a crystalline oxide semiconductor film. The material for the base is also not particularly limited if an object of the present invention is not interfered with, and the base may be a base of a known material. Also, the base may contain an organic compound and/or an inorganic compound.

Also, the base may be in any shape and may be valid for all shapes. Examples of the shape of the base include a plate shape, a flat plate shape and a disk shape, a fibrous shape, a rod shape, a cylindrical shape, a prismatic shape, a tubular shape, a spiral shape, a spherical shape, and a ring shape. According to an embodiment of the present inventive subject matter, the base may be preferably in a plate shape and the thickness of the substrate may not be particularly limited.

According to an embodiment of the present inventive subject matter, the base in a plate shape (hereinafter, also referred to as "the substrate") may be not particularly limited if the substrate serves as a support of the semiconductor layer to be formed on the substrate. The substrate may be an electrically-insulating substrate, a semiconductor substrate, a metal substrate or an electrically-conductive substrate, and also a base including at least one of a metal film, a semiconductor film. The metal film included in the substrate may be preferably a multilayered film. Examples of the substrate may include a base substrate containing a substrate material with a corundum structure as a major component, a base substrate containing a substrate material with a β-gallia structure as a major component, a base substrate containing a substrate material with hexagonal structure as a major component. The term "major component" herein means, for example, an atomic ratio of a substrate material with a certain crystal structure in all the metal elements in a substrate material may be 0.5 or more. According to an embodiment of the present inventive subject matter, the atomic ratio of the substrate material with a certain crystal structure in all the metal elements in the substrate material may be preferably 0.7 or more. According to an embodiment of the present inventive subject matter, the atomic ratio of the substrate material with a certain crystal structure in all the metal elements in the substrate material may be further preferably 0.8 or more.

Furthermore, a material for the substrate is not particularly limited if an object of the present inventive subject matter is not interfered with, and also, the material may be a known one. Examples of a substrate with a corundum structure include $\alpha$-$Al_2O_3$ (sapphire substrate) and $\alpha$-$Ga_2O_3$. Also, according to an embodiment of the present inventive subject matter, the substrate may be an a-plane sapphire substrate, an m-plane sapphire substrate, an r-plane sapphire substrate, a c-plane sapphire substrate, an a gallium oxide substrate (a-plane, m-plane, or r-plane), and the like. Furthermore, examples of the substrate contain a substrate material with a β-gallia structure as a major component include a β-$Ga_2O_3$ substrate, a mixed crystal substrate containing $Ga_2O_3$ and $Al_2O_3$, where $Al_2O_3$ is more than 0 wt % and 60 wt % or less, and the like. Examples of the substrate containing the substrate material with a hexagonal structure as a major component include an SiC substrate, a ZnO substrate, a GaN substrate, and the like.

According to an embodiment of the present inventive subject matter, the substrate may contain a metal or a corundum structure in all or part of a surface of the substrate. When the substrate contains a corundum structure, the substrate may be preferably a base substrate containing a substrate material with a corundum structure as a major component. The substrate may be preferably a sapphire substrate. The substrate may be preferably an a gallium oxide substrate. The substrate may contain aluminum, and in this case, the substrate preferably contains a substrate material containing an aluminum with a corundum structure as a major component. The substrate is preferably a sapphire substrate (preferably, a c-plane sapphire substrate, an a-plane sapphire substrate, an m-plane sapphire substrate, or an r-plane sapphire substrate). Also, the substrate may contain oxide. Examples of oxide substrate include a YSZ substrate, an $MgAl_2O_4$ substrate, a ZnO substrate, an MgO substrate, an $SrTiO_3$ substrate, an $Al_2O_3$ substrate, a quartz substrate, a glass substrate, a β gallium oxide substrate, a barium titanate substrate, a strontium titanate substrate, a cobalt oxide substrate, a copper oxide substrate, a chromium oxide substrate, an iron oxide substrate, a $Gd_3Ga_5O_{12}$ substrate, a potassium tantalate substrate, a lanthanum aluminate substrate, a lanthanum strontium aluminate substrate, a lanthanum strontium gallate substrate, a lithium niobate substrate, a tantalate lithium substrate, lanthanum strontium aluminum tantalate, a manganese oxide substrate, a neodymium gallate substrate, a nickel oxide substrate, a scandium magnesium aluminate substrate, strontium oxide, a strontium titanate substrate, a tin oxide substrate, a tellurium oxide substrate, a titanium oxide substrate, a YAG substrate, a yttrium aluminate substrate, a lithium aluminate substrate, a lithium gallate substrate, a LAST substrate, a neodymium gallate substrate, a yttrium orthovanadate substrate, and the like.

(Atomization and/or Forming Droplets Process)

At the atomization and/or forming droplets process, the raw material solution may be atomized and/or droplets of the raw material solution may be formed. A method to atomize the raw material solution and/or to form droplets of the raw material solution is not limited herein. The method to atomize the raw material solution and/or to form droplets of the raw material solution may be a known method if the raw material solution is able to be atomized and/or formed into droplets.

According to an embodiment of the present inventive subject matter, atomizing the raw material solution by ultrasonic waves to obtain mist and/or forming droplets from the raw material solution by ultrasonic waves is preferable. The mist or droplets obtained using ultrasonic waves have an initial rate of zero to be suspended in the air. The mist obtained using ultrasonic waves is capable of being suspended in a space to be delivered as a gas, is not blown like a spray, for example, and thus, is not damaged by collision energy. Accordingly, the mist obtained using ultrasonic waves is preferable. The size of droplet may not be particularly limited and a droplet may be of approximately several mm, however, according to an embodiment of the present inventive subject matter, the size of droplet may be 50 μm or smaller. Also, according to an embodiment of the present inventive subject matter, the size of droplet may be in a range of 0.1 μm to 10 μm.

<Raw Material Solution>

If the raw material solution contains a material that is able to be atomized and/or to be formed into droplets, the material is not particularly limited, and thus may contain an inorganic material and/or an organic material. However, according to an embodiment of the present inventive subject matter, the material in the raw material solution may be a metal and/or a metal compound. The metal and/or the metal compound is in general a metal or a compound of the metal contained in above mentioned the first semiconductor, the second semiconductor, and the third semiconductor.

According to an embodiment of the present inventive subject matter, a raw-material solution containing at least one metal, in the form of complex or salt, dissolved or dispersed in an organic solvent or water may be used. Examples of the form of the complex may include acetylacetonate complexes, carbonyl complexes, ammine complexes, hydride complexes. Also, examples of the form of the salt may include organic metal salts (e.g., metal acetate, metal oxalate, metal citrate, etc.), metal sulfide salt, metal nitrate salt, metal phosphate salt, metal halide salt (e.g., metal chloride salt, metal bromide salt, metal iodide salt, etc.).

The raw-material solution, may contain hydrohalic acid and/or an oxidant as an additive. Examples of the hydrohalic acid may include hydrobromic acid, hydrochloric acid, hydriodic acid. Among all, hydrobromic acid or hydroiodic acid may be preferable for a reason to obtain a film of better quality. Also, examples of the oxidant include peroxides that include hydrogen peroxide ($H_2O_2$), sodium peroxide ($Na_2O_2$), barium peroxide ($BaO_2$), and benzoyl peroxide ($(C_6H_5CO)_2O_2$), hypochlorous acid (HClO), perchloric acid, nitric acid, ozone water, and organic peroxides that include peracetic acid and nitrobenzene.

The raw-material solution may contain a dopant, which is used to perform doping satisfactory. The dopant is not particularly limited if an object of the present inventive subject matter is not interfered with. Examples of the dopant may include n-type dopants. The n-type dopants may include tin, germanium, silicon, titanium, zirconium, vanadium, and niobium. Also, examples of the dopant may include p-type dopants. The p-type dopants may include Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N or P. The dopant concentration in general may be in a range of $1 \times 10^{16}$/$cm^3$ to $1 \times 10^{22}$/$cm^3$. The dopant concentration may be at a lower concentration of, for example, approximately $1 \times 10^{17}$/$cm^3$ or less. According to an embodiment of the present inventive subject matter, the dopant may be contained at a high concentration of, for example, $1 \times 10^{20}$/$cm^3$ or more.

A solvent of the raw-material solution is not particularly limited, and thus, the solvent may be an inorganic solvent that include water. The solvent may be an organic solvent that includes alcohol. The solvent may be a mixed solvent of the inorganic solvent and the organic solvent. According to an embodiment of the present inventive subject matter, the solvent may contain water. Also, according to an embodiment of the present inventive subject matter, the solvent may be a mixed solvent of water and alcohol.

(Carrying Mist and/or Droplets Process)

At the process for carrying mist and/or droplets, the mist and/or droplets are delivered into a film-formation chamber by carrier gas. The carrier gas is not limited if an object of the present inventive subject matter is not interfered with, and thus, the carrier gas may be oxygen, ozone, an inert gas such as nitrogen and argon. Also, the carrier gas may be a reducing gas that may be a hydrogen gas and/or a forming gas. The carrier gas may contain one or two or more gasses. Also, a diluted carrier gas at a reduced flow rate (e.g., 10-fold diluted carrier gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of the inventive subject matter, the flow rate of the carrier gas may be preferably in a range of 1 to 10 L/min. When a diluted carrier gas is used, the flow rate of the diluted carrier gas may be in a range of 0.001 to 2 L/min. Furthermore, according to an embodiment of an inventive subject matter, when a diluted carrier gas is used, the flow rate of the diluted carrier gas may be in a range of 0.1 to 1 L/min.

(Film Formation Process)

At the film-formation process, a semiconductor layer is formed on a base by thermal reaction of the mist and/or droplets of the raw material solution. The term "thermal reaction" herein includes just a reaction of the mist and/or droplets by heat. Conditions of reaction are not particularly limited only if an object of the present inventive subject matter is not interfered with. In the film-formation process, the thermal reaction is conducted at an evaporation temperature or higher temperature of the evaporation temperature of the solvent of the raw material solution. During the thermal reaction, the temperature should not be too high. For example, the temperature during the thermal reaction may be 1000° C. or less. The temperature during the thermal reaction is preferably 650° C. or less. According to an embodiment of the present inventive subject matter, the temperature during the thermal reaction is further preferably in a range of 300° C. to 650° C. Also, the thermal reaction may be conducted in any atmosphere of a vacuum, a non-oxygen atmosphere, a reducing-gas atmosphere, and an oxygen atmosphere. Also, the thermal reaction may be conducted in any condition of under an atmospheric pressure, under an increased pressure, and under a reduced pressure. According to an embodiment of the present inventive subject matter, the thermal reaction is preferably conducted under an atmospheric pressure. Also, a thickness of the semiconductor layer is able to be set by adjusting a film-formation time.

According to an embodiment of the present inventive subject matter, after the film formation process, annealing may be performed. The annealing temperature may not be particularly limited if an object of the present inventive subject matter is not interfered with. The annealing temperature may be generally from 300° C. to 650° C. According to an embodiment of the present inventive subject matter, the annealing temperature may be preferably from 350° C. to 550° C. Also, the annealing time is generally from 1 minute to 48 hours. According to an embodiment of the present inventive subject matter, the annealing time may be preferably from 10 minutes to 24 hours, and further preferably from 30 minutes to 12 hours. The annealing may be performed in any atmosphere if an object of the present inventive subject matter is not interfered with. The annealing may be performed in a non-oxygen atmosphere. Also, the annealing may be performed in a nitrogen atmosphere.

According to an embodiment of the present inventive subject matter, the semiconductor layer may be provided directly on a base or may be provided on another layer, such as a buffer layer and a stress relief layer, positioned above or below the base.

Layers including a crystalline oxide semiconductor layer may not be particularly limited, and thus, may be formed by a known method. However, a crystalline oxide semiconductor film may be preferably formed by a mist CVD (Chemical Vapor Deposition) apparatus.

According to an embodiment of the present inventive subject matter, a semiconductor layer may include a base, which may be used in a semiconductor device.

In an embodiment of the present inventive subject matter, the semiconductor device is not particularly limited if the semiconductor device include the n-type semiconductor layer, the i-type semiconductor layer and the p-type semiconductor layer. According to an embodiment of the present inventive subject matter, for a reason to realize a better semiconductor characteristics of the semiconductor device, the i-type semiconductor layer may be arranged on the n-type semiconductor layer and the p-type semiconductor layer may be arranged on the i-type semiconductor layer to form a PiN structure. Moreover, according to an embodiment of the present inventive subject matter, the major component of the n-type semiconductor layer and the major component of the i-type semiconductor layer and the major component of the p-type semiconductor layer may be preferably the same, for a reason that the better adhesion between each semiconductor layer (the n-type semiconductor layer, the i-type semiconductor layer and the i-type semiconductor layer) is obtainable by a homozygote. Further, according to an embodiment of the present inventive subject matter, each of the n-type semiconductor layer, the i-type semiconductor layer and the p-type semiconductor layer may contain $\alpha\text{-Ga}_2\text{O}_3$ or a mixed crystal of $\alpha\text{-Ga}_2\text{O}_3$ as a major component.

A preferable p-type semiconductor layer that contains $\alpha\text{-Ga}_2\text{O}_3$ or a mixed crystal of $\alpha\text{-Ga}_2\text{O}_3$ as a major component, may be preferably obtainable, for example, by a mist CVD method using a raw material solution containing a metal, a p-type dopant and a hydrobromic acid. Here, it is important to add a hydrobromic acid as an additive into the raw material solution. Each of a process, a means and a condition of the above-mentioned mist CVD method may be the same as each processes, means and conditions of the above-mentioned atomization and/or forming droplets process, carrying mist and/or droplets process and film forming process. A p-type semiconductor layer obtained by such a method has high bonding property to the i-type semiconductor layer or the n-type semiconductor layer. And for example, the p-type semiconductor layer may be preferably used for a PiN structure of homozygote. If the p-type semiconductor layer may be preferably used for a PiN structure of homozygote, the semiconductor device with an enhanced semiconductor characteristics such as a high breakdown voltage may be obtained. In the preferable embodiment of the present inventive subject matter, the semiconductor device with a breakdown voltage that is 600V or more, even when the thickness of the i-type semiconductor layer is 10 µm or less. In the more preferable embodiment of the present inventive subject matter, the semiconductor device with a breakdown voltage that is 400V or more, even when the thickness of the i-type semiconductor layer is 1 µm or less. Also, in the preferable embodiment of the present inventive subject matter, the semiconductor device with a breakdown voltage that is 400V or more, even when the concentration of the dopant in the i-type semiconductor layer is $1 \times 10^{16}/cm^3$ or more.

The above mentioned semiconductor device preferably has a Schottky electrode on the semiconductor layer. An electrode material of the Schottky electrode is not particularly limited if the electrode material can be used as a Schottky electrode. The electrode material may be an electrically conductive inorganic material and/or electrically conductive organic material. In an embodiment of the present inventive subject matter, the electrode material may be a metal. Examples of the metal may include at least one metal selected from the fourth to eleventh groups of the periodic table. Examples of the metal of the fourth group of the periodic table include titanium (Ti), zirconium (Zr), and hafnium (Hf). According to an embodiment of the present inventive subject matter, Ti may be selected as a metal used for the Schottky electrode. Examples of the metal of the fifth group of the periodic table include vanadium (V), niobium (Nb), and tantalum (Ta). Examples of the metal of the sixth group of the periodic table include one or more metals selected from chromium (Cr), molybdenum (Mo), and tungsten (W). According to an embodiment of the present inventive subject matter, Cr that is expected to enhance switching characteristics of semiconductor device may be selected as a metal used for the Schottky electrode. Examples of the metal of the seventh group of the periodic table include manganese (Mn), technetium (Tc), and rhenium (Re). Examples of the metal of the eighth group of the periodic table include iron (Fe), ruthenium (Ru), and osmium (Os). Examples of the metal of the ninth group of the periodic table include cobalt (Co), rhodium (Rh), iridium (Ir). Examples of the metal of the tenth group of the periodic table include nickel (Ni), palladium (Pd), and platinum (Pt). Among all in the tenth group of the periodic table, platinum (Pt) may be selected. Examples of the metal of the eleventh group of the periodic table include copper (Cu), silver (Ag), and gold (Au). Among all in the eleventh group of the periodic table, gold (Au) may be selected. A forming of the Schottky electrode may be a known method, for example, a dry method or a wet method. Examples of the dry method may include sputtering, vacuum deposition, chemical vapor deposition. Example of the wet method may include a screen painting, die coating.

According to an embodiment of the present inventive subject matter, a semiconductor device may include an ohmic electrode. The ohmic electrode may contain a metal selected from the fourth group and the eleventh group of the periodic table. The ohmic electrode may contain a same metal as a metal that is contained in a Schottky electrode. Also, the ohmic electrode may be a metal layer of a single layer or may contain two or more metal layers, which may be formed by a known method such as vacuum deposition and/or sputtering, and thus a method forming an electrode is not particularly limited. The ohmic electrode may include an alloy. According to an embodiment of the present inventive subject matter, the ohmic electrode may contain Ti and/or Au. The ohmic electrode may preferably contain Ti and Au.

According to an embodiment of the present inventive subject matter, the semiconductor device may be particularly useful for a power device. Examples of the semiconductor device according to the present inventive subject matter include a diode or a transistor (e.g., MESFET, etc.), preferably include a diode, more preferably include a junction barrier Schottky diode (JBS). If gallium used in the semiconductor layer, the semiconductor device preferably comprises a guard ring, for more enhanced semiconductor characteristics such as higher breakdown voltage.

The following descriptions are given to preferred examples of a semiconductor device with reference to the drawings while the present invention is not limited to these examples.

FIG. 1 shows a schematic view of an embodiment of a semiconductor device according to the present inventive subject matter. In this embodiment, the semiconductor device may be a PiN diode. The PiN diode shown in FIG. 1 includes an n-type semiconductor layer 4, an i-type semiconductor layer 3, a p-type semiconductor layer 1, and ohmic electrodes 5. The i-type semiconductor layer 3 is arranged on the n-type semiconductor layer 4, and the p-type semiconductor layer 1 is arranged on the i-type semiconductor layer 3. The ohmic electrodes 5 are arranged on the n-type semiconductor layer 4 and the p-type semiconductor layer 1, respectively. In the first embodiment of the semiconductor device, the i-type semiconductor includes an oxide semiconductor as a major component and the oxide semiconductor that is comprised as the major component of the i-type semiconductor layer includes at least one metal selected from among aluminum, indium and gallium, so that the semiconductor device has high bonding property between the p-type semiconductor layer, n-type semiconductor layer and the i-type semiconductor layer and also has enhanced semiconductor characteristics.

Figure 2:
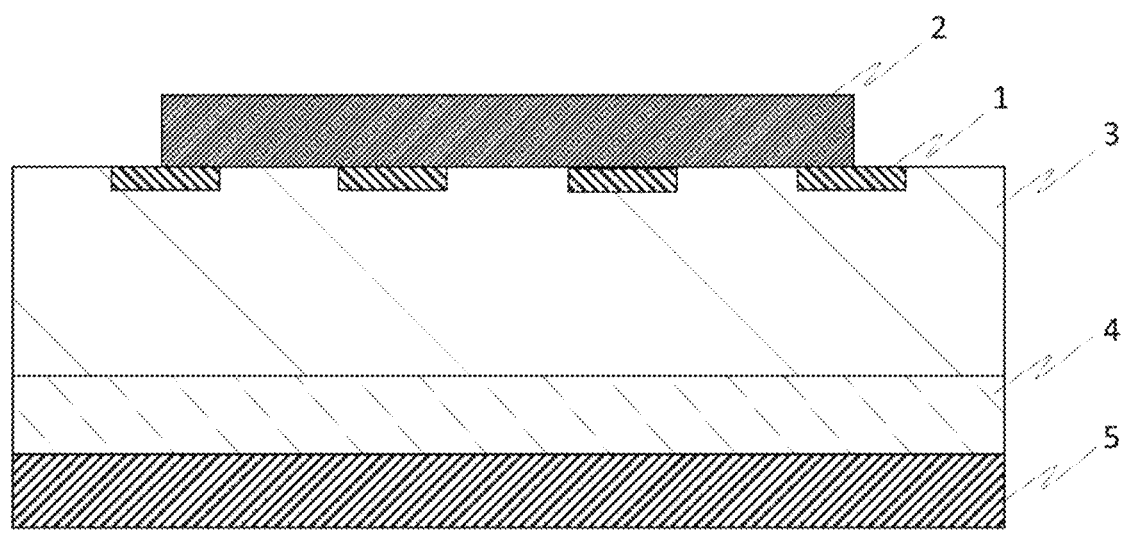
FIG. 2 shows an embodiment of a schematic perspective view of a junction barrier Schottky diode (JBS) according to the present inventive subject matter.

FIG. 2 shows a schematic view of an embodiment of a semiconductor device according to the present inventive subject matter. In this embodiment, the semiconductor device may be a junction barrier Schottky diode (IBS). The JBS shown in FIG. 2 includes an n-type semiconductor layer 4, an i-type semiconductor layer 3, a p-type semiconductor layer 1, and a Schottky electrode 2 and an ohmic electrode 5. The i-type semiconductor is arranged on the n-type semiconductor layer. The Schottky electrode 2 is arranged on the i-type semiconductor and is able to form a Schottky barrier with the i-type semiconductor. The p-type semiconductor layer is positioned between the Schottky electrode and the i-type semiconductor layer. At least a part of the p-type semiconductor layer is embedded in the i-type semiconductor layer. According to an embodiment of the present inventive subject matter, it is preferable to provide the p-type semiconductor layer at a regular intervals. According to an embodiment of the present inventive subject matter, it is further preferable to provide the p-type semiconductor layer between each edge of the Schottky electrode and the i-type semiconductor layer. Such a preferable embodiment of the JBS would enable superior thermal stability, bonding property, further reduced a leakage current, and enhanced semiconductor characteristics such as breakdown voltage.

According to an embodiment of the present inventive subject matter, a forming method of each layer included in the semiconductor device of FIG. 1 and FIG. 2 is not particularly limited and may be a known method. Examples of the method of each layer included in the semiconductor device of FIG. 1 and FIG. 2 may include a method that after forming a film by vacuum deposition, chemical vapor deposition (CVD), sputtering, various coating technology or the like, patterning by photolithography or directly patterning by printing technology.

Figure 3:
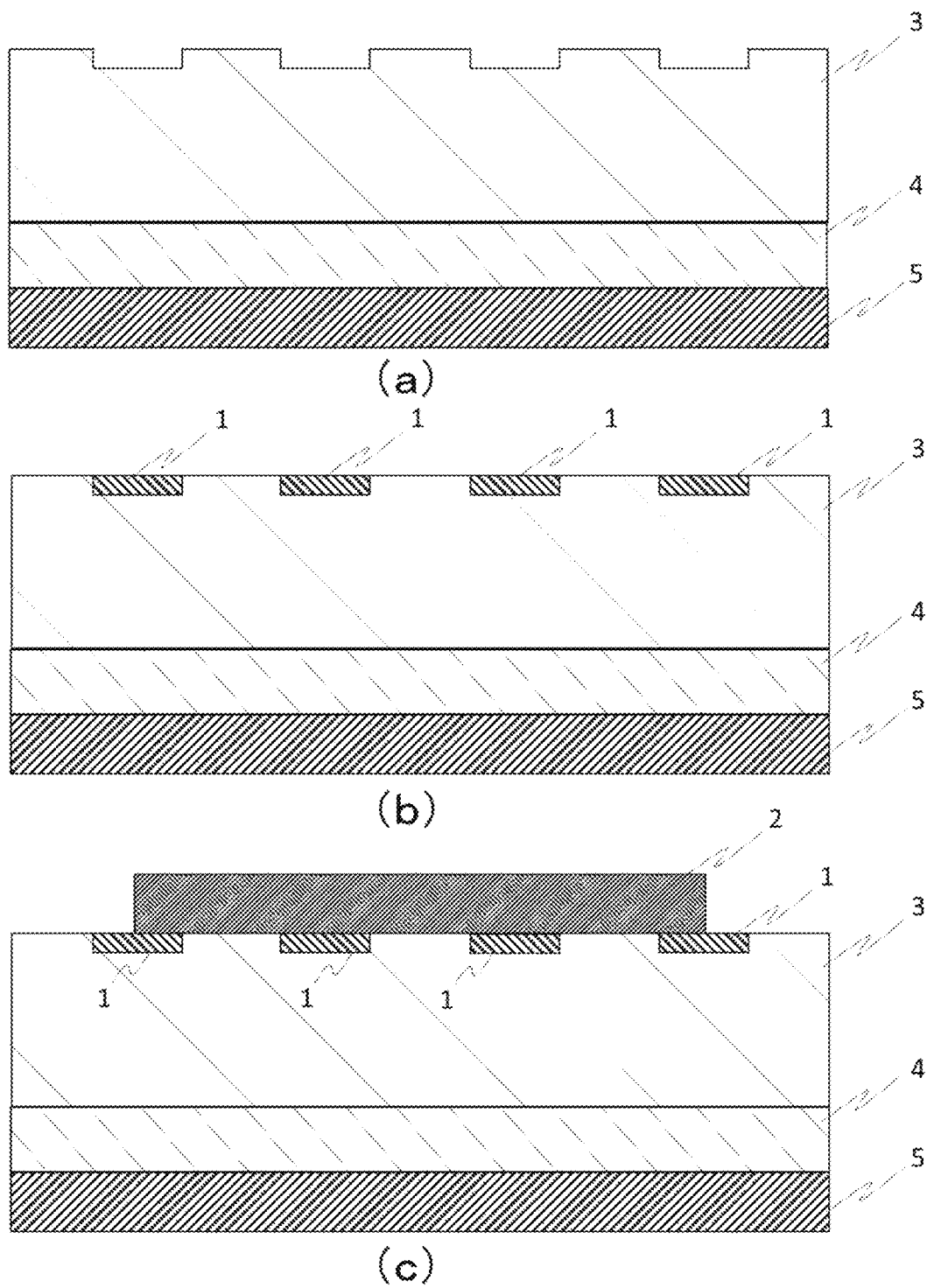
FIG. 3 shows an embodiment of a schematic perspective view of manufacturing a junction barrier Schottky diode (JBS) according to the present inventive subject matter.

The following descriptions are given to preferred examples of a manufacturing process of the JBS of FIG. 2, by using FIG. 3. FIG. 3 (a) shows a laminate including the semiconductor substrate consisting of the n-type semiconductor layer 4 and the i-type semiconductor layer 3, the ohmic electrode 5 arranged on the semiconductor substrate, and two or more trenches that are formed on the opposite surface of the semiconductor substrate. Forming the p-type semiconductor layer 1 in the trench of the i-type semiconductor layer by using photolithography, as shown in FIG. 3 (b). Forming the Schottky electrode on the p-type semiconductor layer and the i-type semiconductor layer by the above-mentioned dry method (preferably vacuum deposition or sputtering) and wet method to obtain the laminate shown in FIG. 3 (c). The laminate shown in FIG. 3 (c) has a PiN structure in which the i-type semiconductor layer 3 is arranged on the n-type semiconductor layer 4 and the p-type semiconductor layer 1 is arranged on the i-type semiconductor layer 3, and thus, is particularly excellent in breakdown voltage.

Figure 4:
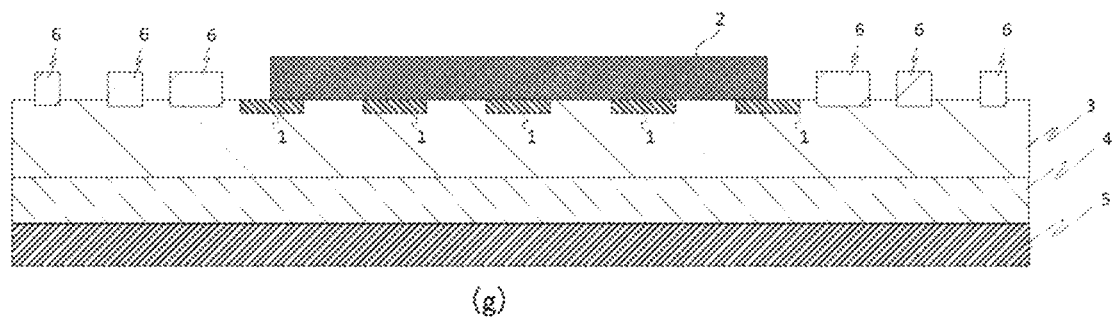
FIG. 4 shows an embodiment of a schematic perspective view of a junction barrier Schottky diode (JBS) according to the present inventive subject matter.

FIG. 4 shows an example of a schematic view of an embodiment of a semiconductor device according to the present inventive subject matter. In this embodiment, the semiconductor device may be a junction barrier Schottky diode (JBS). The JBS of FIG. 4 differs from the JBS of FIG. 2 in that a guard ring is further provided. Such a configuration of FIG. 4 would enable the semiconductor device that is further enhanced in semiconductor characteristics such as breakdown voltage. According to an embodiment of the present inventive subject matter, in case that the i-type semiconductor layer contains an oxide semiconductor comprising gallium, as a major component, configuration of FIG. 4 would enable the semiconductor device that is further more enhanced in breakdown voltage. According to an embodiment of the present inventive subject matter, by embedding at least a part of the guard ring in the surface of the i-type semiconductor layer, the breakdown voltage of the semiconductor device can be more effectively improved. Also, according to an embodiment of the present inventive subject matter, it is preferable to use a metal with a high barrier height as the guard ring, for a reason that the guard ring can be formed together with the Schottky electrode, so that the forming process of the guard ting do not affect the semiconductor layer and on-resistance of the semiconductor device.

In general, the material with a high barrier height is used for the guard ring. Examples of the material of the guard ring may include electrically conductive material with a barrier height of 1 eV or more, and the material of the guard ring may be the same material with the material of the electrodes (Schottoky electrode or ohmic electrode). The shape of the guard ring is not particularly limited and may be a hollow shape, oval shape, circular shape, U-shape, or L-shape, strip shape. According to an embodiment of the present inventive subject matter, the shape of the guard ring may be preferably a hollow shape or a circular shape. A number of the guard ring is not particularly limited and may be 3 or more, may be preferably 6 or more.

Figure 5:
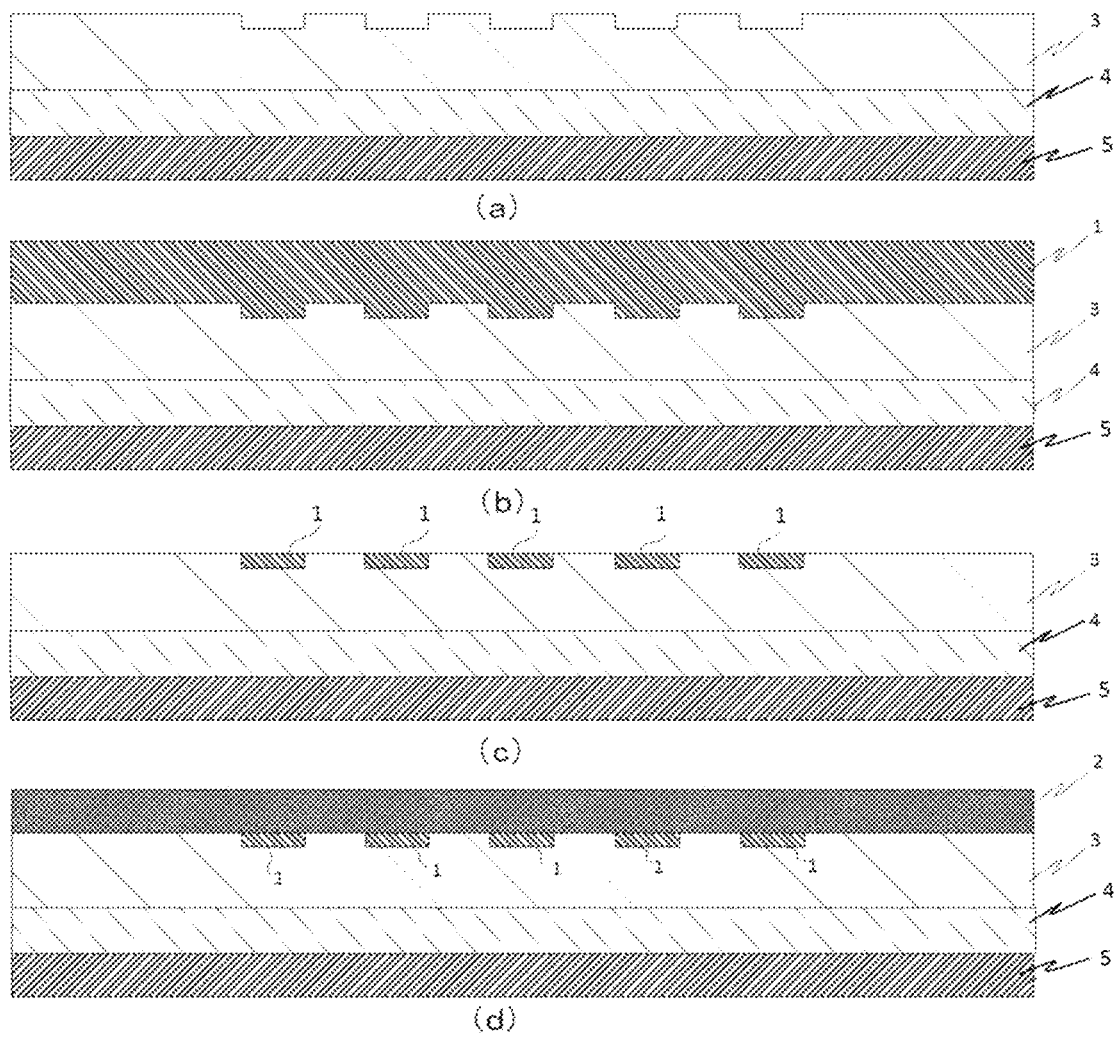
FIG. 5 shows an embodiment of a schematic perspective view of manufacturing a junction barrier Schottky diode (JBS) according to the present inventive subject matter.
Figure 6:
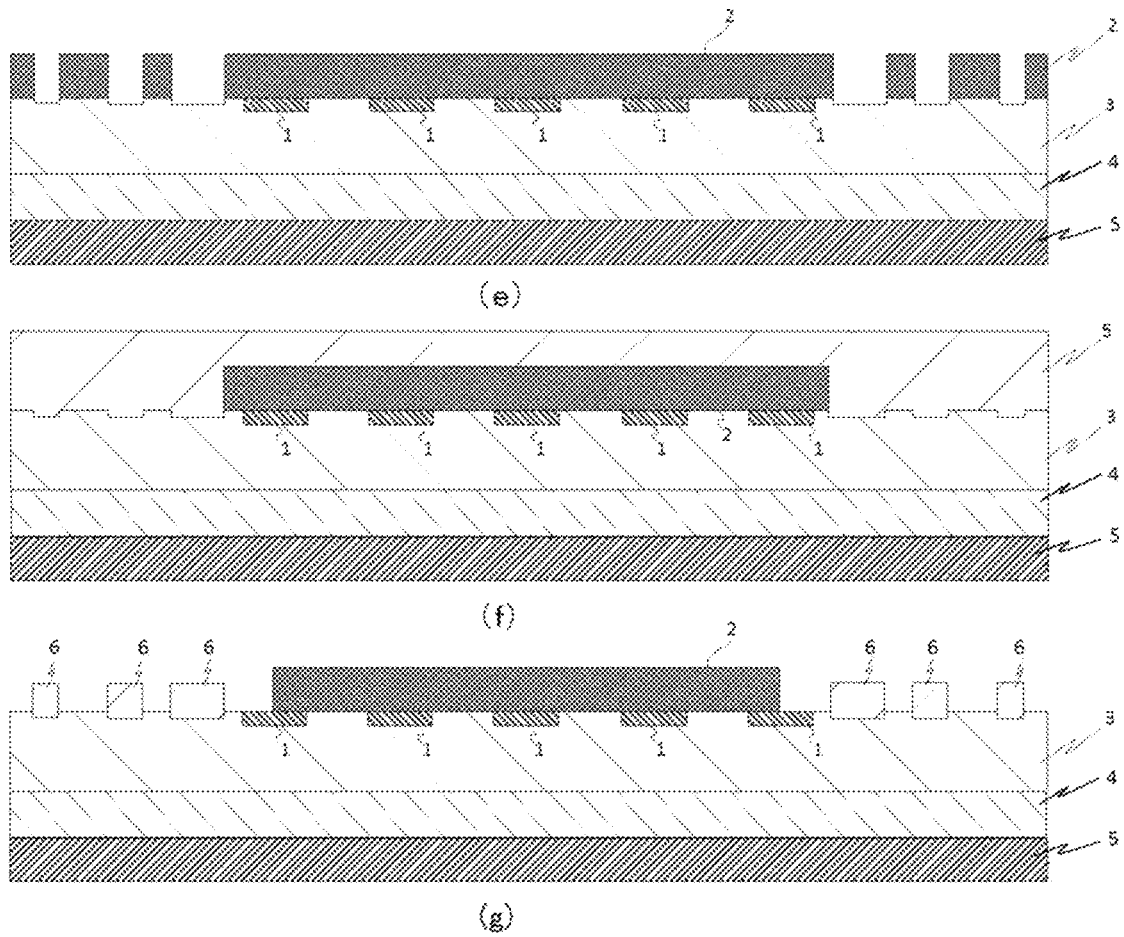
FIG. 6 shows an embodiment of a schematic perspective view of manufacturing a junction barrier Schottky diode (JBS) according to the present inventive subject matter.

The following descriptions are given to preferred examples of a manufacturing process of the JBS of FIG. 4, by using FIG. 5 and FIG. 6. FIG. 5 (a) shows a laminate including the semiconductor substrate consisting of the n-type semiconductor layer 4 and the i-type semiconductor layer 3, the ohmic electrode 5 arranged on the semiconductor substrate, and two or more trenches that are formed on the opposite surface of the semiconductor substrate. Forming the p-type semiconductor layer 1 on the i-type semiconductor layer by using photolithography, as shown in FIG. 5 (b). After forming the p-type semiconductor layer, exposing the surface of the i-type semiconductor layer as shown in FIG. 5 (c). A laminate shown in FIG. 5 (b) and FIG. 5 (c) includes the p-type semiconductor layer 1, the i-type semiconductor layer 3, the n-type semiconductor layer, and the ohmic electrode 5. After obtaining the laminate of FIG. 5 (c), forming the Schottky electrode on the p-type semiconductor layer and the i-type semiconductor layer by the above-mentioned dry method (preferably vacuum deposition or sputtering) or the above-mentioned wet method to obtain the laminate shown in FIG. 5 (d).

Then, removing a part of the Schottky electrode 2 and a part of the i-type semiconductor layer by etching using photolithography, as shown in FIG. 6 (e). After obtaining the laminate shown in FIG. 6 (e), forming a guard ring by the above-mentioned dry method (preferably vacuum deposition or sputtering) or above-mentioned wet method to obtain the laminate shown in FIG. 6 (f). The laminate of FIG. 6 (f) includes the guard ring 6, the Schottky electrode 2, the p-type semiconductor layer 1, the i-type semiconductor layer 3 and the ohmic electrode 5. After obtaining the laminate of FIG. 6(f), removing unnecessary parts by etching using photolithography, to obtain the laminate of FIG. 6 (g). The laminate of FIG. 6 (g) includes the p-type semiconductor layer embedded in the i-type semiconductor layer and further including the guard ring embedded in peripheral portion of the Schottky electrode, and thus, superior in breakdown voltage or the like.

Figure 7:
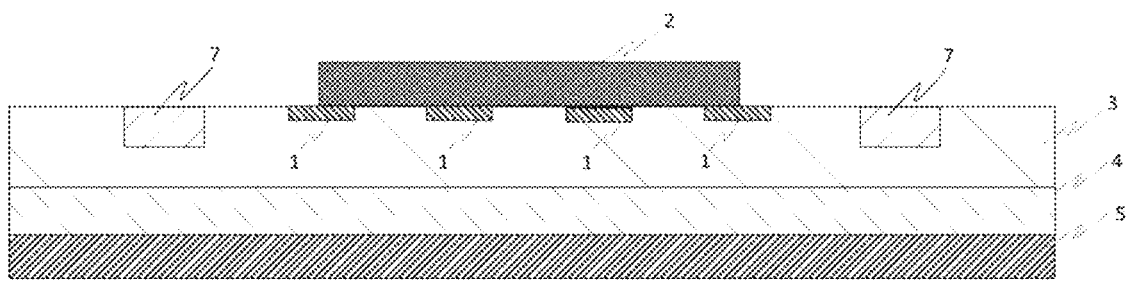
FIG. 7 shows an embodiment of a schematic perspective view of a junction barrier Schottky diode (JBS) according to the present inventive subject matter.

FIG. 7 shows a schematic view of an embodiment of a semiconductor device according to the present inventive subject matter. In this embodiment, the semiconductor device may be a junction barrier Schottky diode (JBS). The JBS of FIG. 7 differs from the JBS of FIG. 2 in that a reduced surface field (RESURF) region is further provided.

The RESURF region, in general, has a lower concentration of dopant than the i-type semiconductor layer. A material used as the RESURF region is not particularly limited and may be the same material with the n-type semiconductor layer, the i-type semiconductor layer, and the p-type semiconductor layer. A shape of the RESURF region is not particularly limited and may be U-shape, or L-shape, strip shape. A number of the RESURF region is not particularly limited and may be 3 or more, may be preferably 6 or more. Also, according to an embodiment of the present inventive subject matter, at least a part of the RESURF region may be arranged in the i-type semiconductor.

According to an embodiment of the present inventive subject matter, a forming method of each layer included in the semiconductor device of FIG. 7 and is not particularly limited and may be a known method. Examples of the method of each layer included in the semiconductor device of FIG. 7 may include a method that after forming a film by vacuum deposition, chemical vapor deposition (CVD), sputtering, various coating technology or the like, patterning by photolithography or directly patterning by printing technology.

Figure 8:
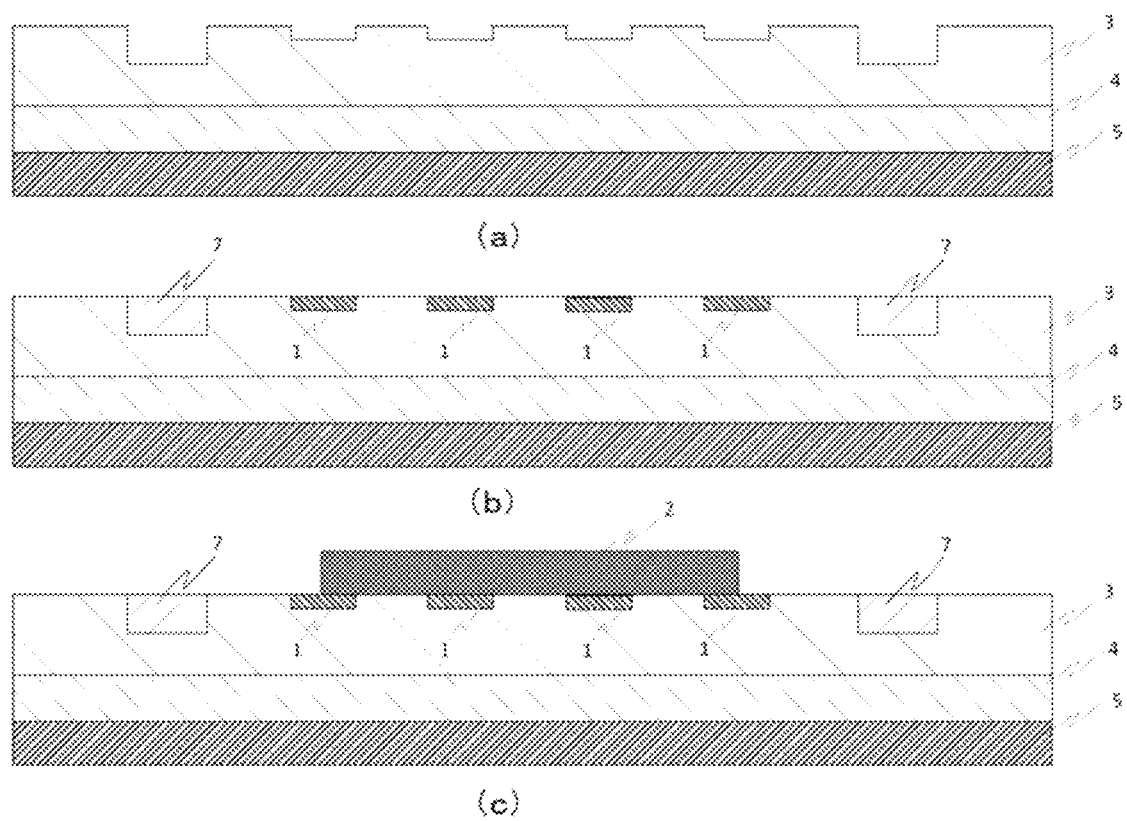
FIG. 8 shows an embodiment of a schematic perspective view of manufacturing a junction barrier Schottky diode (JBS) according to the present inventive subject matter.

The following descriptions are given to preferred examples of a manufacturing process of the JBS of FIG. 7, by using FIG. 8. FIG. 8 (a) shows a laminate including the semiconductor substrate consisting of the n-type semiconductor layer 4 and the i-type semiconductor layer 3, the ohmic electrode 5 arranged on the semiconductor substrate, and two or more trenches that are formed on the opposite surface of the semiconductor substrate. Forming the p-type semiconductor layer 1 and a RESURF region 7 in the trenches of the i-type semiconductor layer by using photolithography, as shown in FIG. 8 (b). After obtaining the laminate of FIG. 8 (b), forming the Schottky electrode on the p-type semiconductor layer and the i-type semiconductor layer by the above-mentioned dry method (preferably vacuum deposition or sputtering) and wet method to obtain the laminate shown in FIG. 8 (c). The laminate of FIG. 8 (c) includes the p-type semiconductor layer embedded in the i-type semiconductor layer and further including the RESURF regions are provided in peripheral portion of the Schottky electrode, and thus, superior in breakdown voltage or the like.

In addition, according to an embodiment of a semiconductor device of the present inventive subject matter, the semiconductor device may be used as a power module, an inverter, and/or a converter in combination with a known structure. Also, a semiconductor device according to the present inventive subject matter may be used in a semiconductor system including a power source, to which the semiconductor device may be electrically connected by a known structure and/or method. The semiconductor device may be electrically connected to a wiring pattern in the semiconductor system.

Figure 9:
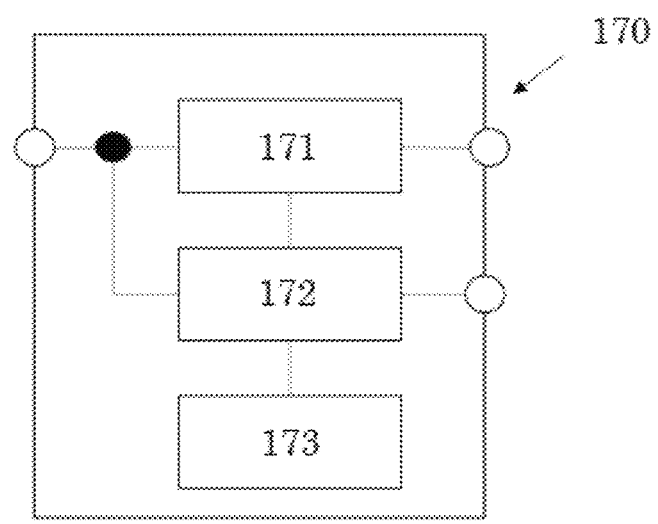
FIG. 9 shows an example of schematic view of a semiconductor system according to an embodiment of the present inventive subject matter.

FIG. 9 shows schematic view of a semiconductor system according to an embodiment of the present inventive subject matter. The semiconductor system may be a power system 170. The power system 170 may include two or more power devices and a control circuit. The power system 170 shown in FIG. 9 may include a first power system 171 and a second power system 172 and a control circuit 173 that are electrically connected in the power system 170.

Figure 10:
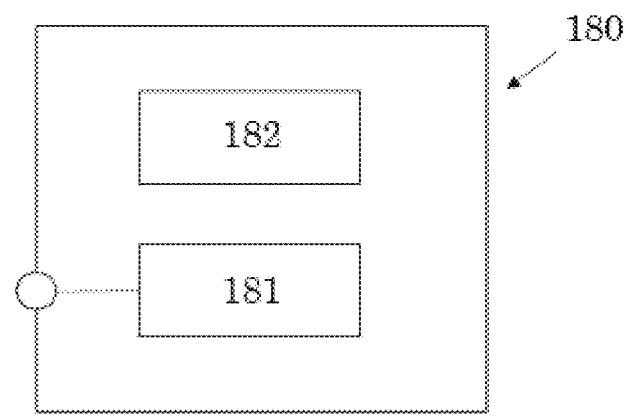
FIG. 10 shows a schematic view of a semiconductor system according to an embodiment of the present inventive subject matter.

FIG. 10 shows a schematic view of a semiconductor system according to an embodiment of the present inventive subject matter. The semiconductor system may be a system device 180, as shown in FIG. 10. The system device 180 may include a power system 181 and an electric circuit 182 that may be combined with the power system 181.

Figure 11:
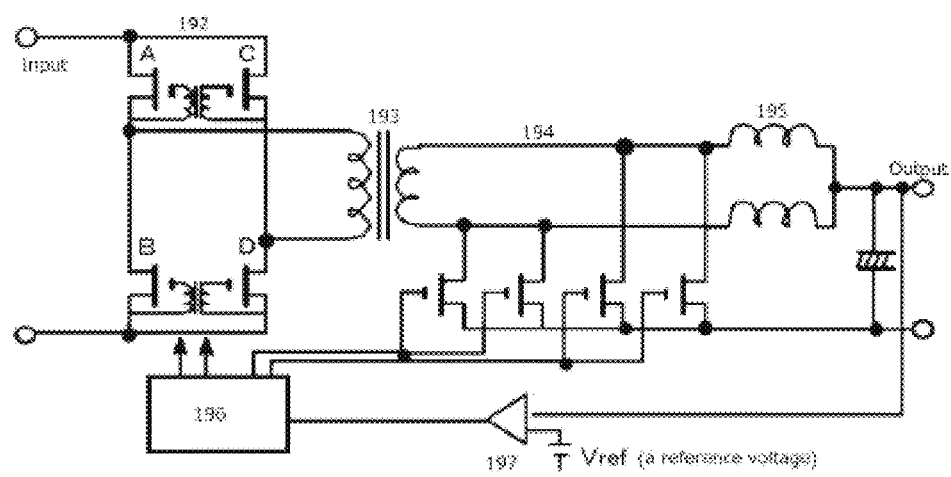
FIG. 11 shows a schematic view of a circuit diagram of power supply of a semiconductor system according to an embodiment of the present inventive subject matter.
Figure 12:
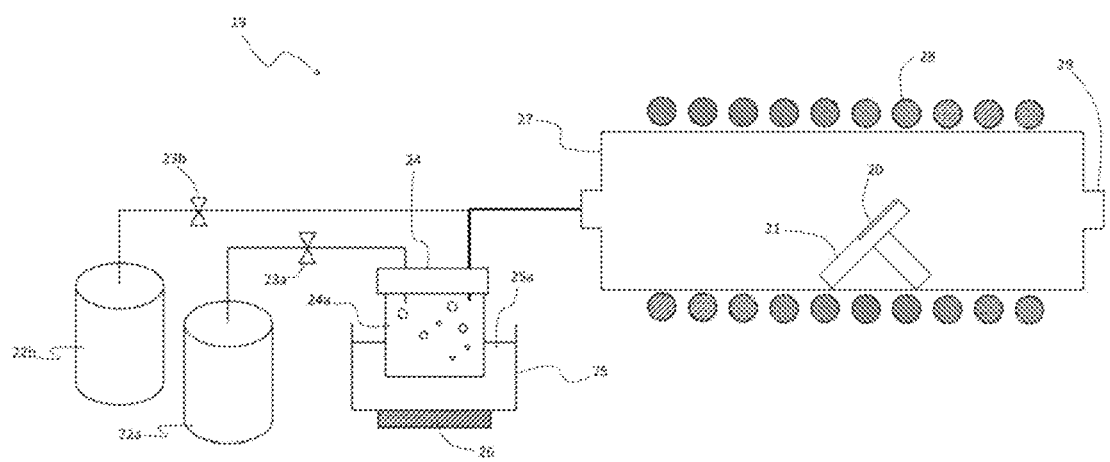
FIG. 12 shows a schematic diagram of a mist chemical vapor deposition (CVD) apparatus that may be used according to an embodiment of method of the present inventive subject matter.

FIG. 11 shows a schematic view of a circuit diagram of power supply of a semiconductor system according to an embodiment of the present inventive subject matter. FIG. 11 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator 197 to control the inverter and the rectification MOSFETs by a PWM control circuit 196 to have a desired output voltage.

Example I

1. Formation of the n-Type Semiconductor Layer
1-1. Film Formation Apparatus

Regarding a film-formation apparatus, a mist CVD apparatus 19 used in an embodiment method according to the present inventive subject matter is described with FIG. 6. The mist CVD apparatus 19 may include a susceptor 21 on which a substrate 20 is placed. The mist CVD apparatus 19 includes a carrier gas supply device 22a, a first flow-control valve 23a to control a flow of a carrier gas that is configured to be sent from the carrier gas supply device 22a, a diluted carrier gas supply device 22b, a second flow-control valve 23b to control a flow of a carrier gas that is configured to be sent from the carrier gas supply device 22b, a mist generator 24 in that a raw material solution 24a is contained, a container 25 in that water 25a is contained, an ultrasonic transducer that may be attached to a bottom surface of the container 25, a supply pipe 27 that may be a quartz pipe with an inside diameter that may be 40 mm, and a heater 28 arranged at a peripheral portion of the supply pipe. The susceptor 21 includes a surface that is slanted off the horizontal and on that the substrate 20 is arranged. The susceptor 21 is made of quartz. Since the susceptor 21 and the supply pipe 27 that are configured to be a film-formation chamber are made of quartz, this configuration reduces a possibility that a foreign substance entering a film that is formed on the substrate 20.

1-2. Preparation of a Raw-Material Solution 20

Tin bromide was mixed to a 0.05 M aqueous gallium acetylacetonate solution, and the aqueous gallium acetylacetonate solution containing tin bromide was prepared to have an atomic ratio of tin to gallium that is 1:0.02, and at this point, hydrobromic acid was contained in the aqueous gallium acetylacetonate solution containing tin bromide to have a volume ratio of 3% of the aqueous solution that would be a raw-material solution.

1-3. Film Formation Preparation

The raw-material solution 24a obtained at 2-2. the Preparation of the Raw-Material Solution above was set in the mist generator 24. Then, an $n^+$-type semiconductor film that was separated from a sapphire substrate was placed on the susceptor 21, and the heater 28 was activated to raise the temperature in the film-formation chamber 27 up to 630° C. The first flow-control valve 23a and the second flow-control valve 23b were opened to supply a carrier gas from the carrier gas source 22a and the diluted carrier gas source 22b, which are the source of carrier gas, into the film-formation chamber 27 to replace the atmosphere in the film-formation chamber 27 with the carrier gas sufficiently. After the atmosphere in the film formation chamber 27 was sufficiently replaced with the carrier gas, the flow rate of the carrier gas from the carrier gas source 22a was regulated at 1.0 L/min. and the diluted carrier gas from the diluted carrier gas source 22b was regulated at 1.0 L/min. In this embodiment, nitrogen was used as the carrier gas.

1-4. Formation of a Film

The ultrasonic transducer 26 was then vibrated at 2.4 MHz, and the vibration propagated through the water 25a to the raw material solution 24a to atomize the raw material solution 24a to form a mist. The mist was introduced in the film formation chamber 27 with the carrier gas. The mist was thermally reacted at 630° C. under atmospheric pressure in the film formation chamber 27 to form a film on the substrate 20. The film formation time was 120 minutes.

1-5. Evaluation

Using an X-ray diffraction (XRD) device, a phase of the film obtained at 1-4 the formation of the film described above was identified as $\alpha\text{-Ga}_2\text{O}_3$. The semiconductor film obtained in this embodiment may be used as a semiconductor layer in a semiconductor device. 2. Formation of the i-type semiconductor layer The i-type semiconductor layer was formed on the n-type semiconductor layer obtained at 1-4, using same conditions as those used in 1, except for three conditions of using a tin bromide was mixed to a 0.1 M aqueous gallium bromide solution, and the aqueous gallium bromide solution containing tin bromide was prepared to have an atomic ratio of tin to gallium that is 1:0.02, and at this point, hydrobromic acid was contained in the aqueous gallium bromide solution containing tin bromide to have a volume ratio of 20% of the aqueous solution that would be a raw-material solution, the temperature of film formation to be 520° C., and the film formation time to be 60 minutes. In this process, the formation of the i-type semiconductor layer was conducted so that at least a part of a surface of the n-type semiconductor was exposed for forming a contact electrode. Using an X-ray diffraction (XRD) device, a phase of the film obtained at 1-4 the formation of the film described above was identified as α-$Ga_2O_3$.

3. Formation of the p-Type Semiconductor Layer

The p-type semiconductor layer was formed on the i-type semiconductor layer obtained at 2, using same conditions as those used in 1, except for three conditions of using a magnesium bromide was mixed to a 0.1 M aqueous gallium bromide solution, and the aqueous gallium bromide solution containing tin bromide was prepared to have an atomic ratio of tin to gallium that is 1:0.02, and at this point, hydrobromic acid was contained in the aqueous gallium bromide solution containing tin bromide to have a volume ratio of 1% of the aqueous solution that would be a raw-material solution, the temperature of film formation to be 580° C., and the film formation time to be 60 minutes. Using an X-ray diffraction (XRD) device, a phase of the film obtained at 1-4 the formation of the film described above was identified as α-$Ga_2O_3$.

4. Formation of Electrode

As a contact electrode (an ohmic electrode), Ti was formed on the n-type semiconductor layer and Pt was formed on the p-type semiconductor layer, by using photolithography, etching, and electric beam evaporation to produce a semiconductor device.

5. Evaluation of the Semiconductor Device

Figure 13:
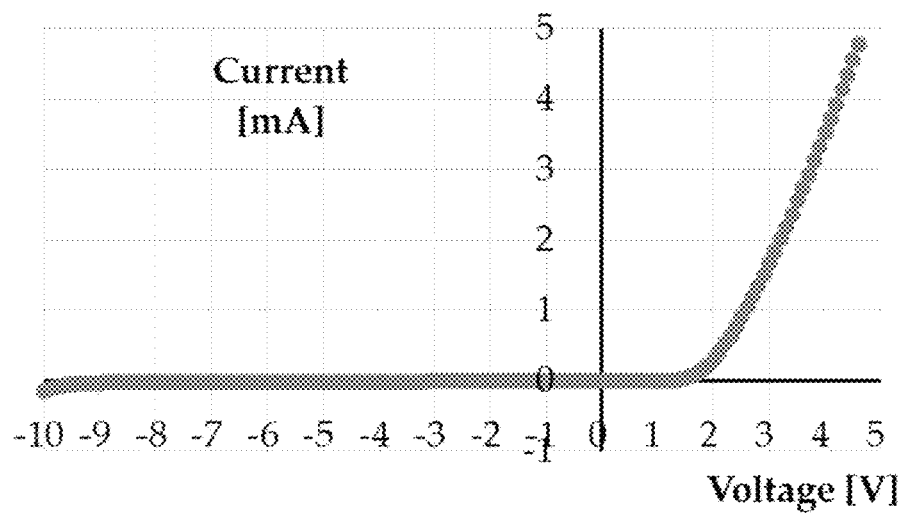
FIG. 13 shows a result of Current-Voltage (IV) measurement of a semiconductor device according to an embodiment of the present inventive subject matter.

The semiconductor device obtained by the above-mentioned method was subjected to Current-Voltage (IV) measurement. The result of IV measurement is shown in FIG. 13. As apparent from FIG. 13, the semiconductor device has a satisfactory rectifying property and the n-type semiconductor layer, the i-type semiconductor layer and the p-type semiconductor layer have a excellent bonding property. Also, as the magnesium properly works as a p-type dopant, it is apparent that α-$Ga_2O_3$, which is the same material as the n-type semiconductor layer and the i-type semiconductor layer can be used as the p-type semiconductor layer, which enables the homozygous PiN structure. (Calculation of Breakdown Voltage)

Figure 14:
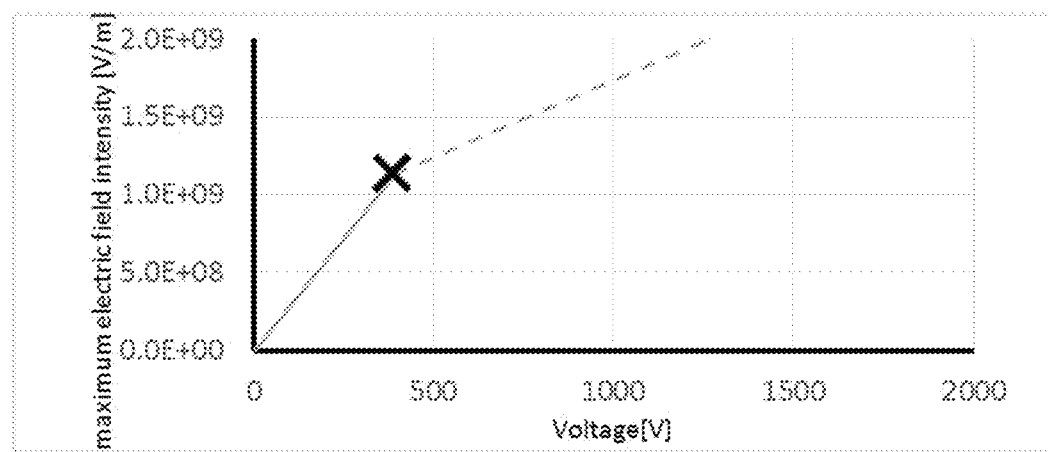
FIG. 14 shows a diagram showing the relationship between electric field intensity and voltage calculated from the IV measurement result of FIG. 13.
Figure 15:
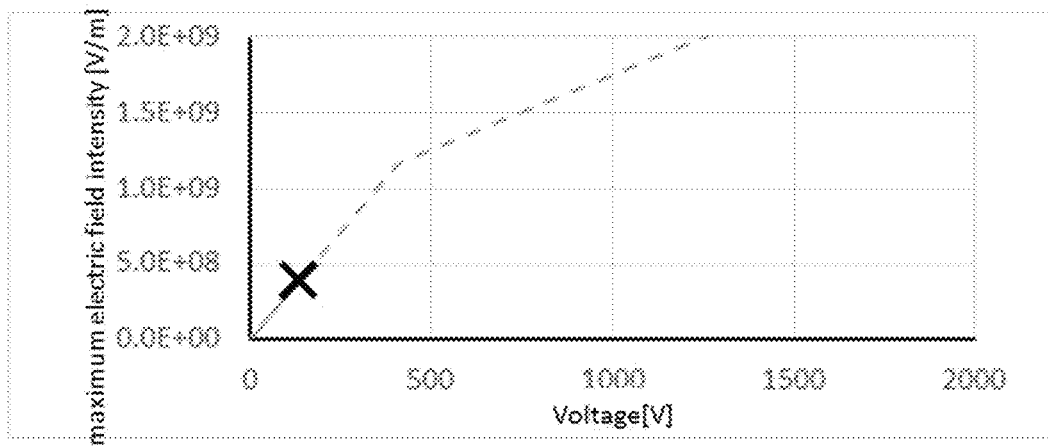
FIG. 15 shows a diagram showing the relationship between electric field intensity and voltage in the case of SiC.
Figure 16:
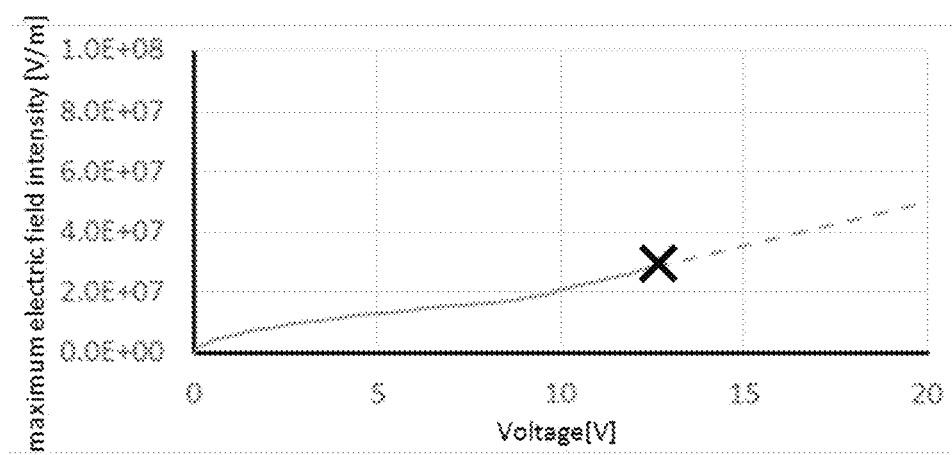
FIG. 16 shows is a diagram showing the relationship between electric field intensity and voltage in the case of Si.

The relationship between electric field intensity and voltage was calculated from the result of the above-mentioned IV measurement result and the values shown in table. 1. The calculation result is shown in FIG. 14. Also, for comparison, the relationship between electric field intensity and voltage was also calculated in the case of (1) SiC and (2) Si, using same conditions as FIG. 14. These results are shown in FIG. 15 and FIG. 16.

TABLE 1

| | symbol | unit | value |
| --- | --- | --- | --- |
| Unit charge | q | [C.] | $1.6 \times 10^{-19}$ |
| Boltzmann's constant | k | [J/K] | $1.38 \times 10^{-23}$ |
| Planck's constant | h | [Js] | $6.63 \times 10^{-34}$ |
| The mass of the electron | m0 | [kg] | $9.11 \times 10^{-31}$ |
| Dielectric constant of vacuum | ε0 | [F./m] | $8.85 \times 10^{-12}$ |
| Dielectric constant of Si | | | 11.8 |
| Dielectric constant of SiC | | | 9.7 |
| Dielectric constant of α-$Ga_2O_3$ | | | 10 |

TABLE 1-continued

| | symbol | unit | value |
| --- | --- | --- | --- |
| Band gap of Si | | [eV] | 1.1 |
| Band gap of SiC | | [eV] | 3.4 |
| Band gap of α-$Ga_2O_3$ | | [eV] | 5.4 |
| Absolute temperature | | [K] | 300 |
| Carrier concentration of i-type semiconductor layer | | [/$cm^3$] | $1.15 \times 10^{16}$ |
| Carrier concentration of n-type semiconductor layer | | [/$cm^3$] | $1.23 \times 10^{19}$ |
| Carrier concentration of p-type semiconductor layer | | [/$cm^3$] | $1.00 \times 10^{18}$ |
| Thickness of i-type semiconductor layer | | [μm] | 1.0 |

A breakdown voltage obtained from the diagram shown in FIG. 14 was approximately 400V, that is 30 times or more as large as in the case of (2) Si and 3 times or more as large as in the case of (1) SiC. These results show that homozygous PiN structure using α-$Ga_2O_3$ has further enhanced breakdown voltage and superior semiconductor characteristics compared to traditional PiN structure using Si or SiC.

Also, as apparent from FIG. 14, according to an embodiment of the present inventive subject matter, even if the thickness of the i-type semiconductor layer is relatively thin, the semiconductor device with satisfactory high breakdown voltage can be obtained. According to an embodiment of the present inventive subject matter, when α-$Ga_2O_3$ is used for the n-type semiconductor layer and/or the i-type semiconductor layer, the semiconductor layer with satisfactory high breakdown voltage can be obtained even if the carrier concentration of the n-type semiconductor layer and/or the i-type semiconductor layer is relatively high ($1 \times 10^{16}$/cm3 or more, for example).

Therefore, the semiconductor device according to an embodiment of the present inventive subject matter is excellent in bonding property between the n-type semiconductor layer, the i-type semiconductor layer and the p-type semiconductor layer, and thus, the semiconductor device according to an embodiment of the present inventive subject matter has enhanced semiconductor properties such as high breakdown voltage.

REFERENCE NUMBER DESCRIPTION 1 a p-type semiconductor layer
2 a Schottky electrode
3 an i-type semiconductor layer
4 a n-type semiconductor layer
5 an ohmic electrode
6 a guard ring
7 a reduced surface field (RESURF) region
19 a mist CVD Apparatus
20 a substrate
21 a susceptor
22a a carrier gas supply device
22b a diluted carrier gas supply device
23a a first flow-control valve
23b a second flow-control valve
24 a mist generator
24a a raw material solution
25 a container
25a water
26 an ultrasonic transducer
27 a supply pipe
28 a heater
29 an air duct

What is claimed is:

1. A semiconductor device comprising:
an n-type semiconductor layer;
an i-type semiconductor layer; and
a p-type semiconductor layer;
wherein the i-type semiconductor layer has a first carrier concentration,
wherein the n-type semiconductor layer has a second carrier concentration that is larger than the first carrier concentration,
wherein the p-type semiconductor layer has a third carrier concentration that is larger than the first carrier concentration,
wherein the i-type semiconductor layer comprises an oxide semiconductor as a major component,
wherein the oxide semiconductor that is comprised as the major component of the i-type semiconductor layer comprises at least one metal selected from among aluminum, indium, and gallium, and
wherein a breakdown voltage of the semiconductor device is 400 V or more.

2. The semiconductor device according to claim 1,
wherein the i-type semiconductor layer is arranged on the n-type semiconductor layer, and
wherein the p-type semiconductor layer is arranged on the i-type semiconductor layer to form a PiN structure.

3. The semiconductor device according to claim 1,
wherein the oxide semiconductor that is comprised as the major component of the i-type semiconductor layer comprises gallium.

4. The semiconductor device according to claim 1,
wherein the oxide semiconductor that is comprised as the major component of the i-type semiconductor layer comprises a corundum structure, a β-gallia structure or an ε-type structure.

5. The semiconductor device according to claim 1,
wherein the n-type semiconductor layer comprises an oxide semiconductor as a major component, and
wherein the oxide semiconductor that is comprised as the major component of the n-type semiconductor layer comprises gallium.

6. The semiconductor device according to claim 5,
wherein the oxide semiconductor that is comprised as the major component of the n-type semiconductor layer comprises a corundum structure, a β-gallia structure or an ε-type structure.

7. The semiconductor device according to claim 1,
wherein the p-type semiconductor layer comprises an oxide semiconductor as a major component, and
wherein the oxide semiconductor that is comprised as the major component of the p-type semiconductor layer comprises a d-block metal in the periodic table.

8. The semiconductor device according to claim 7,
wherein the oxide semiconductor that is comprised as the major component of the p-type semiconductor layer comprises a metal of Group 9 of the periodic table.

9. The semiconductor device according to claim 7,
wherein the oxide semiconductor that is comprised as the major component of the p-type semiconductor layer comprises a corundum structure, a β-gallia structure or an ε-type structure.

10. The semiconductor device according to claim 1, further comprising:
a reduced surface field (RESURF) region.

11. The semiconductor device according to claim 1, further comprising
a guard ring.

12. The semiconductor device according to claim 1,
wherein the semiconductor device is a diode.

13. The semiconductor device according to claim 1,
wherein the semiconductor device is a power device.

14. A semiconductor device comprising:
an n-type semiconductor layer;
an i-type semiconductor layer; and
a p-type semiconductor layer,
wherein the i-type semiconductor layer has a first carrier concentration,
wherein the n-type semiconductor layer has a second carrier concentration that is larger than the first carrier concentration,
wherein the p-type semiconductor layer has a third carrier concentration that is larger than the first carrier concentration,
wherein the p-type semiconductor layer comprises an oxide semiconductor as a major component,
wherein the oxide semiconductor that is comprised as the major component of the p-type semiconductor layer comprises iridium or gallium, and
wherein a breakdown voltage of the semiconductor device is 400 V or more.

15. The semiconductor device according to claim 14,
wherein the n-type semiconductor layer comprises an oxide semiconductor as a major component, and
wherein the oxide semiconductor that is comprised as the major component of the n-type semiconductor layer comprises at least one metal selected from among aluminum, indium, and gallium.

16. The semiconductor device according to claim 15,
wherein the oxide semiconductor that is comprised as the major component of the n-type semiconductor layer comprises at least gallium.

17. The semiconductor device according to claim 14,
wherein the oxide semiconductor that is comprised as the major component of the p-type semiconductor layer comprises gallium.

18. A semiconductor device comprising:
an n-type semiconductor layer;
an i-type semiconductor layer; and
a p-type semiconductor layer,
wherein the i-type semiconductor layer has a first carrier concentration,
wherein the n-type semiconductor layer has a second carrier concentration that is larger than the first carrier concentration, and
wherein the p-type semiconductor layer has a third carrier concentration that is larger than the first carrier concentration,
wherein the n-type semiconductor layer comprises an oxide semiconductor as a major component,
wherein the oxide semiconductor that is comprised as the major component of the n-type semiconductor layer comprises at least one metal selected from among aluminum, indium, and gallium, and
wherein a breakdown voltage of the semiconductor device is 400 V or more.

19. The semiconductor device according to claim 18,
wherein the i-type semiconductor layer comprises an oxide semiconductor as a major component, and the oxide semiconductor that is comprised as the major component of the i-type semiconductor layer comprises one selected from among a corundum structure, a β-gallia structure or an ε-type structure.

20. The semiconductor device according to claim 18, wherein the oxide semiconductor that is comprised as the major component of the n-type semiconductor layer comprises at least gallium.

* * * * *